(12) United States Patent
Muraki et al.

(10) Patent No.: US 7,632,716 B2
(45) Date of Patent: Dec. 15, 2009

(54) PACKAGE FOR HIGH FREQUENCY USAGES AND ITS MANUFACTURING METHOD

(75) Inventors: Ichirou Muraki, Mine (JP); Kouichi Nakasu, Onoda (JP); Akiyoshi Osakada, Mine (JP)

(73) Assignee: Sumitomo Metal (SMI) Electronics Devices, Inc., Yamaguchi (JP)

( * ) Notice: Subject to any disclaimer, the term of this patent is extended or adjusted under 35 U.S.C. 154(b) by 392 days.

(21) Appl. No.: 11/382,407

(22) Filed: May 9, 2006

(65) Prior Publication Data

US 2006/0193116 A1    Aug. 31, 2006

Related U.S. Application Data

(62) Division of application No. 10/859,526, filed on Jun. 1, 2004, now abandoned.

(30) Foreign Application Priority Data

| Jun. 9, 2003 | (JP) | ............................. 2003-163429 |
| Oct. 29, 2003 | (JP) | ............................. 2003-368371 |
| Jan. 29, 2004 | (JP) | ............................. 2004-020663 |

(51) Int. Cl.
*H01L 31/024* (2006.01)
*H01L 23/36* (2006.01)

(52) U.S. Cl. .............................. 438/122; 257/E23.101; 257/E23.103

(58) Field of Classification Search ........................ None
See application file for complete search history.

(56) References Cited

U.S. PATENT DOCUMENTS 3,780,795 A    12/1973    Arnold (Continued)

FOREIGN PATENT DOCUMENTS

JP    02-077143 A    3/1990

(Continued)

OTHER PUBLICATIONS

Patent Abstracts of Japan for JP04-233752 published on Aug. 21, 1992.

(Continued)

*Primary Examiner*—Zandra Smith
*Assistant Examiner*—Pamela E Perkins
(74) *Attorney, Agent, or Firm*—Darby & Darby P.C.

(57) ABSTRACT

A package for high frequency usages 10 has a notched area 16 on each longitudinal end of a substantially rectangular heat sink plate 11 for fastening the package to a base 20 with a screw. The package includes a joined member 17 formed by joining a surface of a ring-like frame member 12 made of a ceramic material to the longitudinal center of a surface of heat sink plate 11 and joining another surface to an external connection terminal 15. The other surface of heat sink plate 11 presents a curved protruding shape 18 bowing from its longitudinal ends toward its longitudinal center, so that curved protruding shape 18 causes at least an area of the other surface heat sink plate 11 that corresponds to an area dedicated for mounting a semiconductor device 19 within ring-like frame member 12 to make a close contact with base 20 when the package is fastened to base 20 by the screw at notched areas 16.

4 Claims, 11 Drawing Sheets

U.S. PATENT DOCUMENTS

| | | | |
|---|---|---|---|
| 4,151,547 A | 4/1979 | Rhoades et al. | |
| 4,415,025 A | 11/1983 | Horvath | |
| 4,535,835 A | 8/1985 | Holden | |
| 4,611,238 A | 9/1986 | Lewis et al. | |
| 4,802,532 A | 2/1989 | Dawes et al. | |
| 4,854,377 A | 8/1989 | Komoto et al. | |
| 4,872,505 A | 10/1989 | Jones et al. | |
| 4,979,074 A | 12/1990 | Morley et al. | |
| 5,172,755 A | 12/1992 | Samarov | |
| 5,508,560 A | 4/1996 | Koehler et al. | |
| 5,585,672 A * | 12/1996 | Koike et al. | 257/707 |

FOREIGN PATENT DOCUMENTS

| | | | |
|---|---|---|---|
| JP | 04-096355 A | | 3/1992 |
| JP | 04-233752 A1 | | 8/1992 |
| JP | 07-273236 A | | 10/1995 |
| JP | 10-270612 A1 | | 10/1998 |
| JP | 11-289037 A1 | | 10/1999 |
| JP | 2000-200865 A1 | | 7/2000 |
| JP | 2000-286371 A1 | | 10/2000 |
| JP | 2001-230349 A1 | | 8/2001 |
| JP | 2002-324865 A | | 11/2002 |
| JP | 2003-115732 A | | 4/2003 |
| JP | 2003-282752 A | | 10/2003 |
| JP | 2004-014827 A | | 1/2004 |
| JP | 2004-022964 A | | 1/2004 |

OTHER PUBLICATIONS

Patent Abstracts of Japan for JP10-270612 published on Oct. 9, 1998.

Patent Abstracts of Japan for JP11-289037 published on Oct. 19, 1999.

Patent Abstracts of Japan for JP2000-200865 published on Jul. 18, 2000.

Patent Abstracts of Japan for JP2000-286371 published on Oct. 13, 2000.

Patent Abstracts of Japan for JP2001-230349 published on Aug. 24, 2001.

\* cited by examiner

FIG. 1A

PRIOR ART

FIG. 1B

PRIOR ART

Hard Resin    Soft Resin    Hard Resin

PACKAGE FOR HIGH FREQUENCY USAGES AND ITS MANUFACTURING METHOD

INCORPORATION BY REFERENCE

This application is a divisional of U.S. patent application Ser. No. 10/859,526 filed Jun. 1, 2004 and claims the benefit of Japanese Patent Application Nos. 2003-163429 filed Jun. 9, 2003, 2003-368371 filed Oct. 29, 2003 and 2004-020663 filed Jan. 29, 2004. The content of the applications are incorporated herein by reference, in their entirety.

FIELD OF THE INVENTION

The invention relates to an apparatus and a package for high frequency usages formed by joining a heat sinking plate with a ring-shaped frame member made of ceramics, in particular, where the heat sink plate is affixed to the base plate, and their manufacturing method.

BACKGROUND OF THE INVENTION

Packages for high frequency usages equipped with high frequency, high power semiconductors such as gallium arsenide field effect transistors have been used, for example, for RF (radio frequency) base stations. A high frequency semiconductor device generates a lot of heat when it is operating, so it may fail to work properly unless the generated heat is efficiently dissipated into the air. Therefore, a package for high frequency uses is typically equipped with a heat sink made of a substantially rectangular metal plate to provide a high heat dissipating characteristic with an area for mounting a semiconductor device. A ring-shaped frame member made of ceramics is joined on the outer periphery of the semiconductor mounting area of the heat sink plate. The space surrounded by the ring-shaped frame member and the heat sink forms a cavity for storing the semiconductor device.

After the semiconductor device is mounted on the heat sink plate, the upper surface of the ring-shaped frame is hermetically sealed with a cap member that seals the cavity. Also, external connection terminals are connected between the ring-shaped frame member and the cap member for signal input/output. The package for high frequency usages equipped with a sealed semiconductor is then affixed on the base plate to allow the heat transmitted to the heat sink to dissipate to the outside. Affixation is done by fastening the notched areas formed on both ends of the heat sink plate in the lengthwise direction using screws.

Figure 1A:
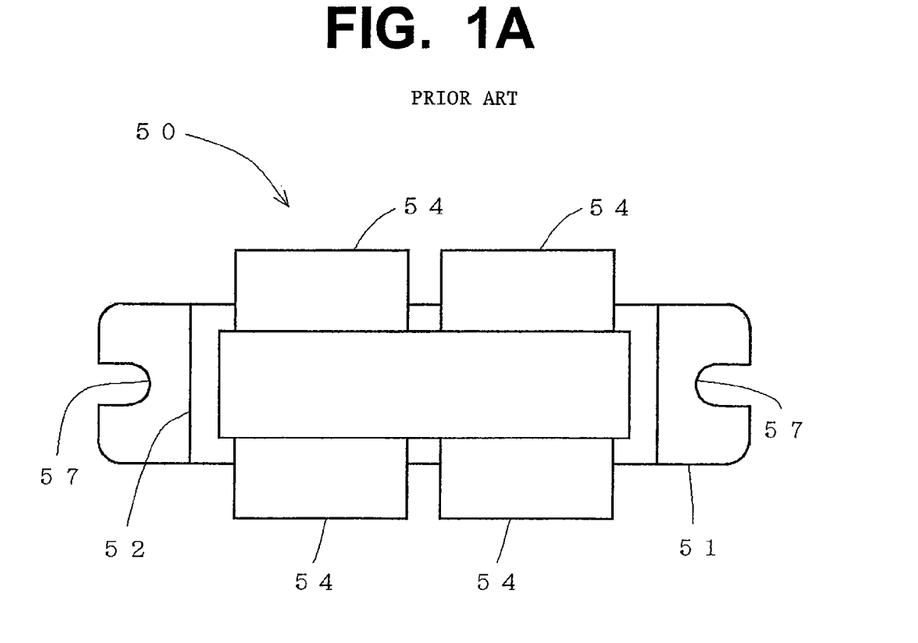
FIGS. 1A and 1B are descriptive drawings of a typical package for high frequency usages of the prior art.
Figure 1B:
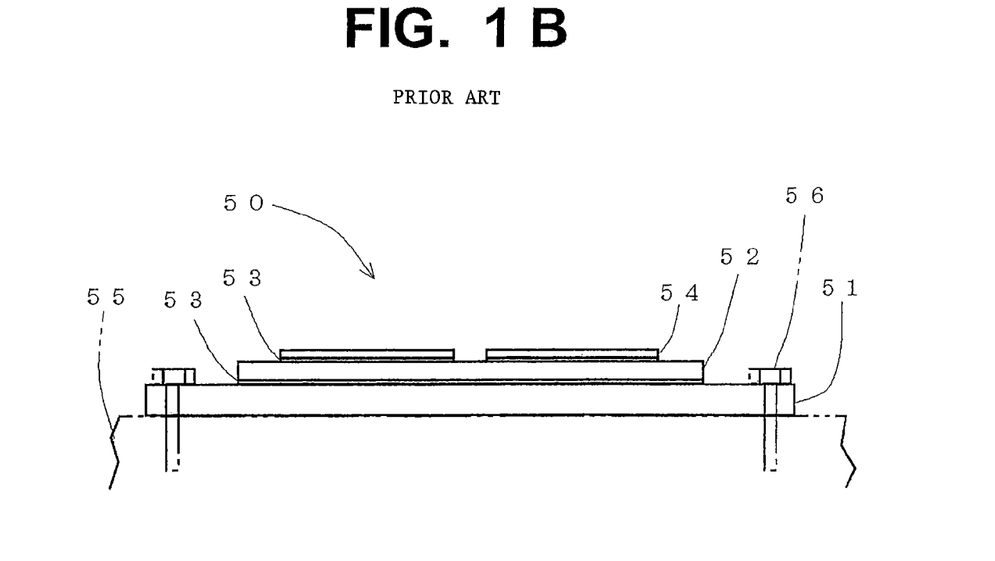

FIGS. 1(A) and (B) show a typical high frequency package 50 of the prior art. Number 51 denotes a heat sink plate having a thermal expansion coefficient close to that of the ceramic material made of a compound metal material with an excellent thermal dissipation characteristic such as copper-tungsten (Cu—W), and number 52 denotes a ring-shaped frame member made of a ceramic material such as alumina ($Al_2O_3$).

A metallic conductor pattern is formed on the front and back surfaces of ring-shaped frame member 52. The metallic conductor pattern on the back surface of ring-shaped frame member 52 and heat sink plate 51 are joined by means of brazing via Ag—Cu brazing metal 53. External connection terminals 54 are joined to the metallic conductor pattern on the surface of ring-shaped frame member 52 via Ag—Cu brazing metal 53. The brazing process is conducted by heating after placing ring-like frame member 52 on heat sink plate 51 via Ag—Cu brazing metal 53 and placing external connection terminals 54 on ring-like frame member 52 via Ag—Cu brazing metal 53. The metal surfaces of heat sink plate 51, ring-like frame member 52, and external connection terminals 54 are to be covered with metallic plating such as Ni plating and Au plating. A notch 57 is provided on each end of heat sink plate 51 in its longitudinal direction for fastening heat sink plate 51 to a base plate 55 with a screw.

Similar attempts of prior art include the kind where a sheet of indium is sandwiched between the heat sink plate and the base plate for improving thermal conductivity between the heat sink plate and the base plate, all of which are fastened together with screws (Japanese Laid-open Publication 2001-230349) or having a protrusion on each of the heat sink plate in its longitudinal direction for fastening with screws (Japanese Laid-open Publication H4-233752).

However, these packages of high frequency usages of prior art and their manufacturing methods have the following problems:

(1) While the heat sink plate and the external connection terminals are made of materials whose thermal expansion coefficients are similar to that of the ring-shaped frame member, it is difficult to match the thermal expansion coefficients of the heat sink plate and the external connection terminals perfectly with that of the ring-shaped frame member, so that it generates a stress in the joined area of high temperature brazing using Ag—Cu brazing metal. Consequently, a buckling occurs in the joined member. Since joined members with buckling that exceeds the tolerance limit cannot be used, it is a common practice to screen them against such a tolerance limit. More specifically, if the bottom surface of a heat sink plate, which is to be joined to the base plate, is caused to buckle in a concave shape, a space is created between the base plate and the heat sink when it is mounted on the base plate, thus affecting the heat dissipation characteristic. Therefore, it is necessary to select only those with convex buckling shapes. Thus, it mandates a selection process and lowers the yield, resultantly increasing the cost of the packages for high frequency uses.

(2) Using an indium sheet between the heat sink plate and the base plate brings about a cost increase for a package for high frequency usages because of the high cost of the indium sheet. Moreover, the use of an insertion such as an indium sheet makes the assembly process more complicated thus resulting in a cost increase for a package for high frequency usages.

(3) When a protrusion is provided at an end of the longitudinal direction of the heat sink plate, the package size is increased by the protrusion provided. For this reason, the need for miniaturization is not met.

(4) In forming the metallic plating film on the heat sink plate by means of a electrolytic plating method, the thickness of the heat sink plate on both ends tends to become too thick compared to the middle of the plate in its longitudinal direction, thus causing the bottom surface that is to be joined to the base plate of the heat sink plate to buckle into a concave shape. This generates a space between the heat sink plate and the base plate when it is mounted on the high frequency package on the base plate, resultantly affecting the thermal dissipation characteristics.

The present invention was made under the circumstance and is intended to provide an inexpensive package for high frequency usages having an excellent thermal dissipation characteristic.

SUMMARY OF THE INVENTION

An apparatus or a package for high frequency usages according to one embodiment of the present invention has a surface of a heat sink plate intended for contacting with a base plate. The heat sink plate has a convex shape warped along its longitudinal direction. Another package for high frequency usages according to an embodiment of the present invention has a plated coating formed on the surface of the heat sink plate intended for contacting with the base plate and the plated surface has a convex shape warped along its longitudinal direction.

Because of the above constitution, these packages for high frequency usages can provide improved efficiencies in dissipating heat when the heat sink plates are fastened on the base plates with screws as they make close contacts, thus preventing degradations of semiconductor devices they carry.

PREFERRED EMBODIMENTS OF THE INVENTION

The following descriptions of various embodiments with reference to the accompanying drawings should be helpful for understanding of the invention.

First Embodiment

Figure 2A:
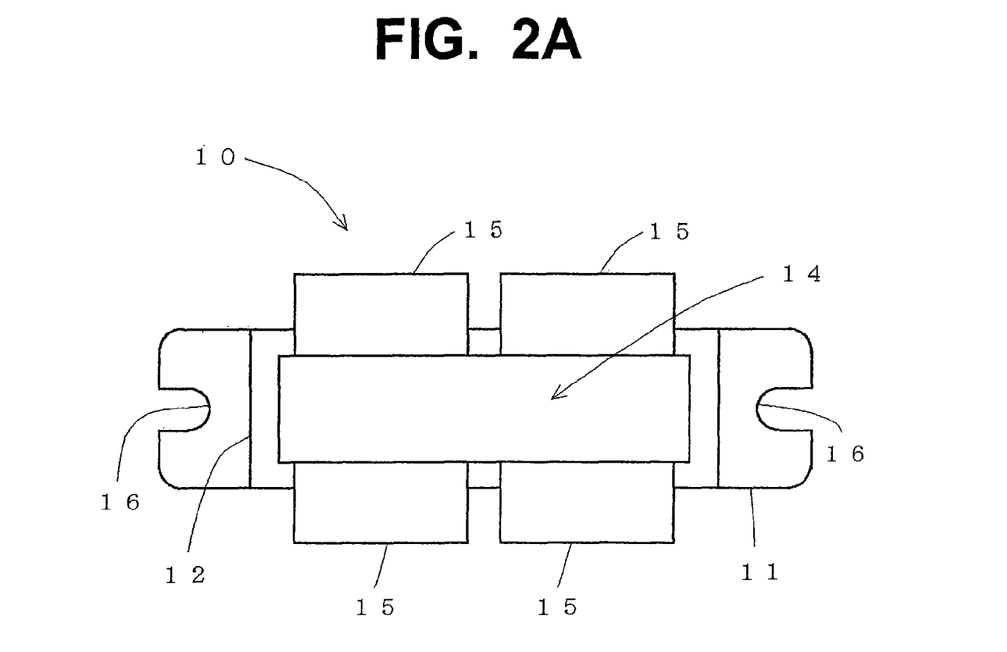
FIGS. 2A and 2B are a plan view and a front view of a package for high frequency usages according to a first embodiment of the present invention.
Figure 2B:
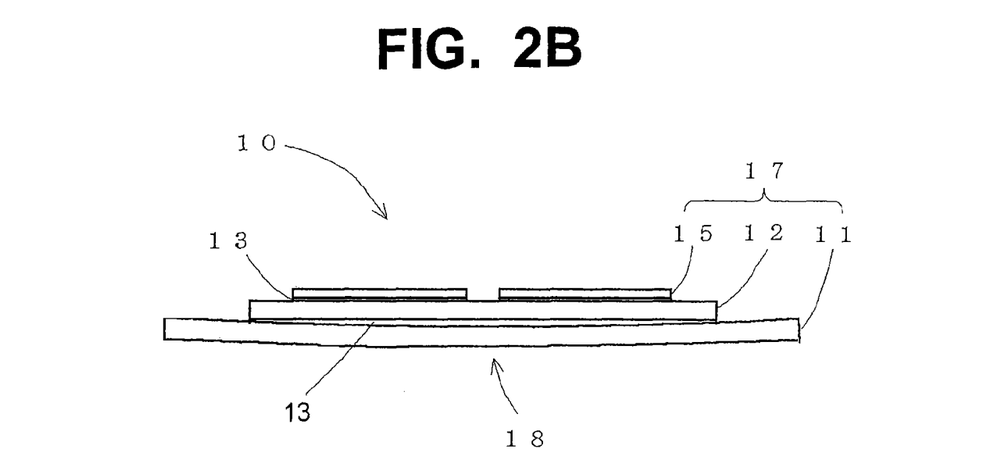

As can be seen in FIGS. 2(A) and (B), a package 10 for high frequency usages according to the first embodiment of the present invention has a ring-shaped frame member 12 made of ceramics joined to a heat sink plate 11 by means of brazing using high temperature brazing material 13.

Heat sink plate 11 consists of a substantially rectangular metallic plate with a thermal expansion coefficient similar to that of the ceramic material used and a high temperature dissipating characteristic for dissipating a large amount of heat generated by the semiconductor to be mounted on it.

Figure 3A:
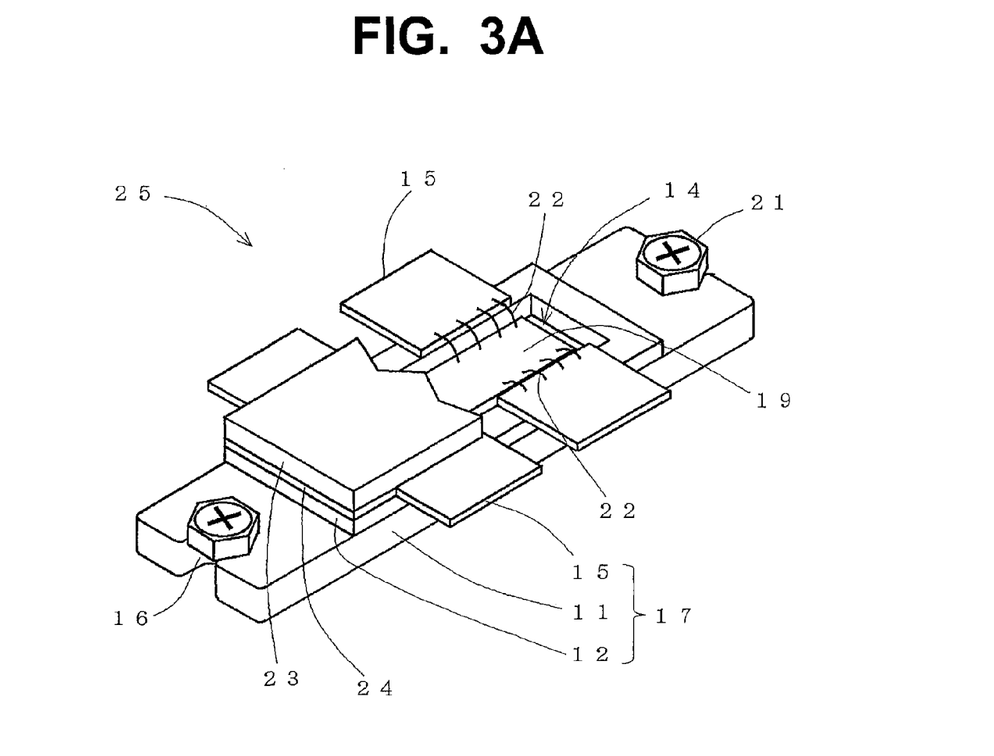
FIG. 3A is a view showing a semiconductor device mounted on a package for high frequency usages according to the first embodiment of the invention.

Also, external connection terminals 15 are joined to the top surface, which is the other surface, i.e., top surface, of ring-like frame member 12 for electrically connecting a semiconductor device 19 (see FIG. 3(A)) to the outside, by means of brazing using high temperature brazing material 13. Heat sink plate 11, ring-like frame member 12, and external connection terminal 15 form a joined member 17.

Figure 3B:
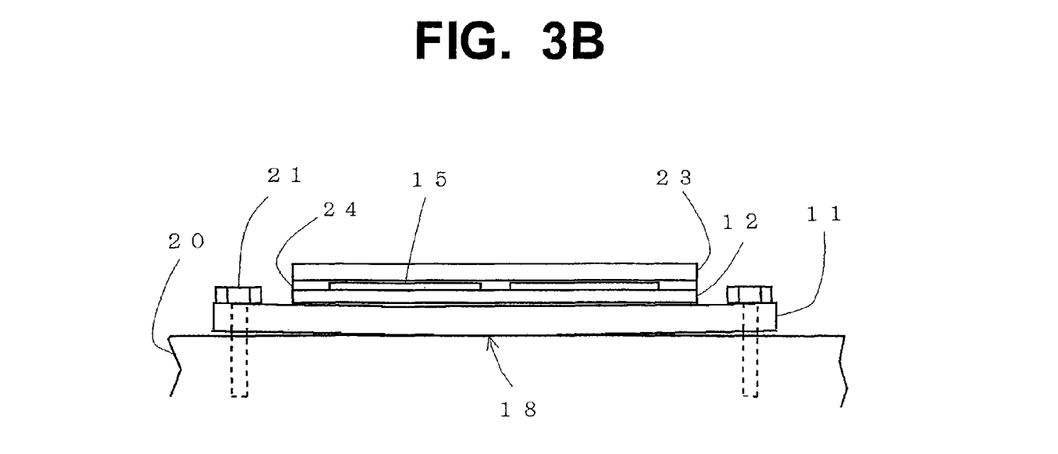
FIG. 3B is a view of the same package being affixed to the base plate.

A notched area 16 is formed on each end of heat sink plate 11 in its longitudinal direction for fastening it to base plate 20 (see FIG. 3(B)) with screws 21 (FIGS. 3(A) and (B)).

Semiconductor device 19 is die-bonded in a cavity 14 of package 10 for high frequency usages, and semiconductor device 19 connects to external connection terminals 15 with bonding wires 22. Next, cavity 14 is hermetically sealed by a cap member 23 made of a plastic, ceramic, metallic, or other material to ring-like frame member 12 with a plastic, glass or other adhesive 24 to form a module substrate 25 for high frequency usages. Notched areas 16 are formed on heat sink plate 11 for inserting screws 21, and module substrate 25 for high frequency uses is fastened to base plate 20 with screws 21. After fastening it with the screws, the other surface of heat sink plate 11 of package 10 of high frequency usages has a convex shape 18 so that the part that corresponds to the mounting area of semiconductor device 19 can make a close contact with base plate 20. Therefore, the heat dissipated from the semiconductor device to heat sink 11 is efficiently transmitted to base plate 20.

Second Embodiment

Figure 4A:
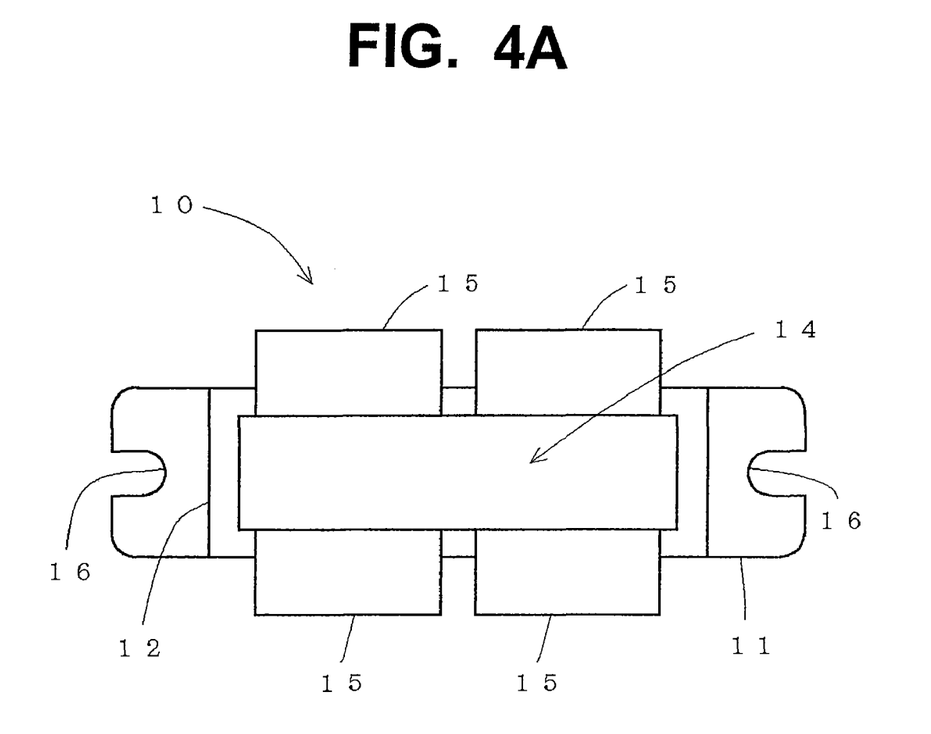
FIGS. 4A and 4B are a plan view and a front view of a package for high frequency usages according to a second embodiment of the invention
Figure 4B:
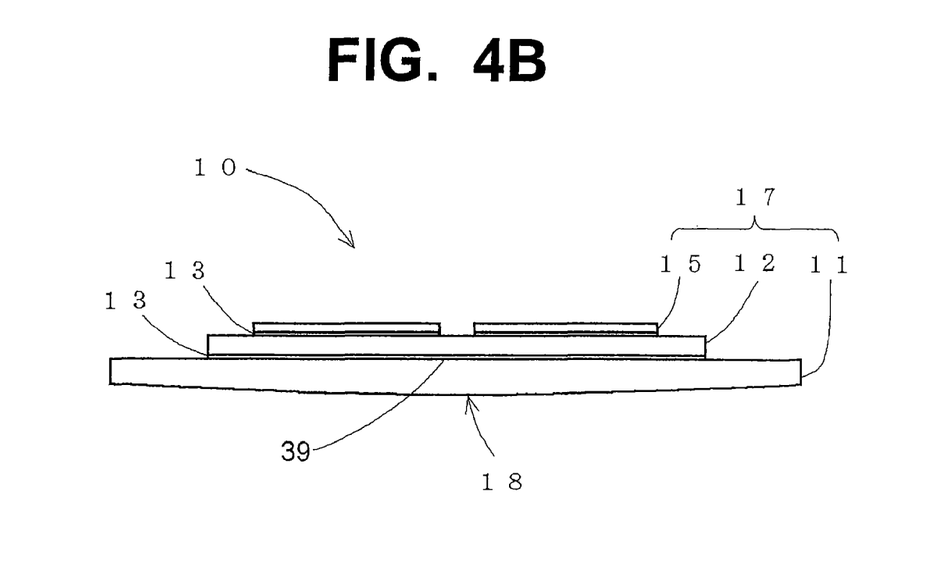
Figure 5A:
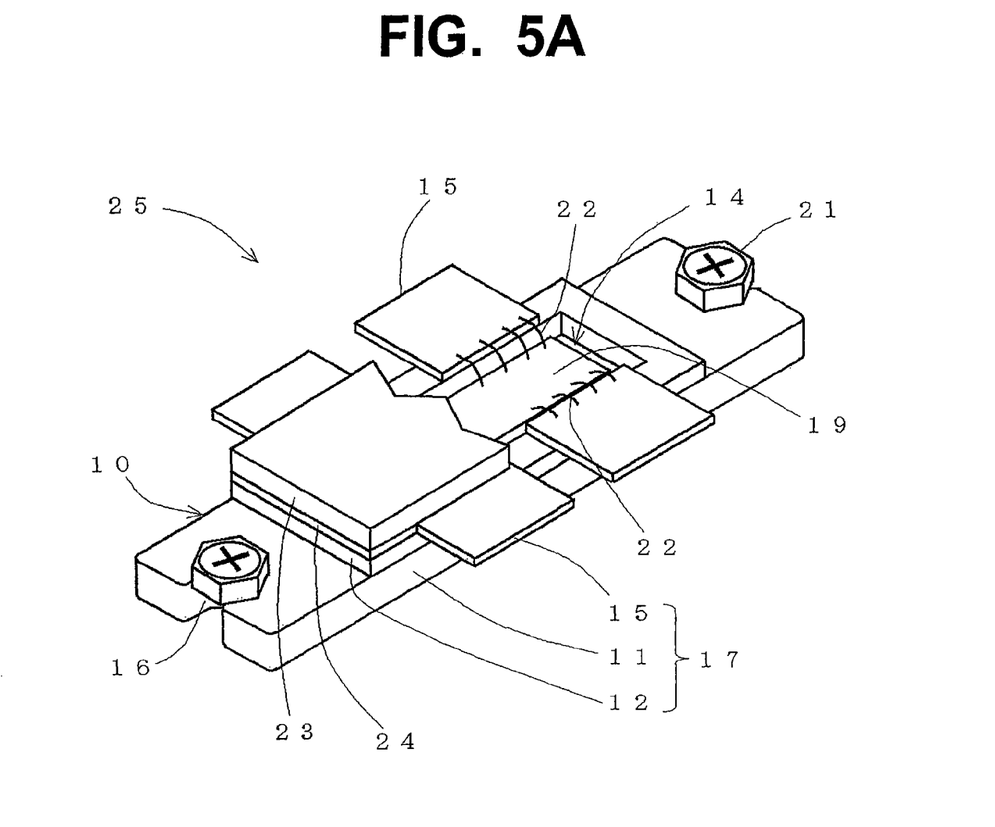
FIG. 5A is a view of a semiconductor device mounted on a package for high frequency usages according to the second embodiment of the invention.
Figure 5B:
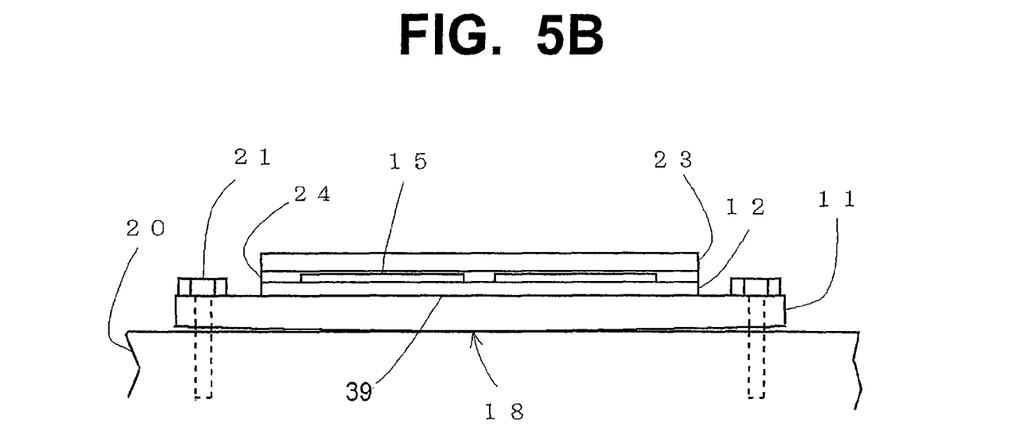
FIG. 5B is a view of the same package being affixed to the base plate.

FIGS. 4(A) and (B) are a plan view and a front view of a package for high frequency usages according to a second embodiment of the invention respectively, while FIGS. 5(A) and (B) are descriptive drawings of a semiconductor device mounted on a package for high frequency usages. In the second embodiment, it is similar to the first embodiment in that the bottom surface of heat sink plate 11 is formed into a convex shape 18, but a semiconductor device mounting surface 39 of the heat sink plate is formed flat. This makes it possible to mount the semiconductor device on the heat sink plate in a stable manner.

Third Embodiment

Figure 6A:
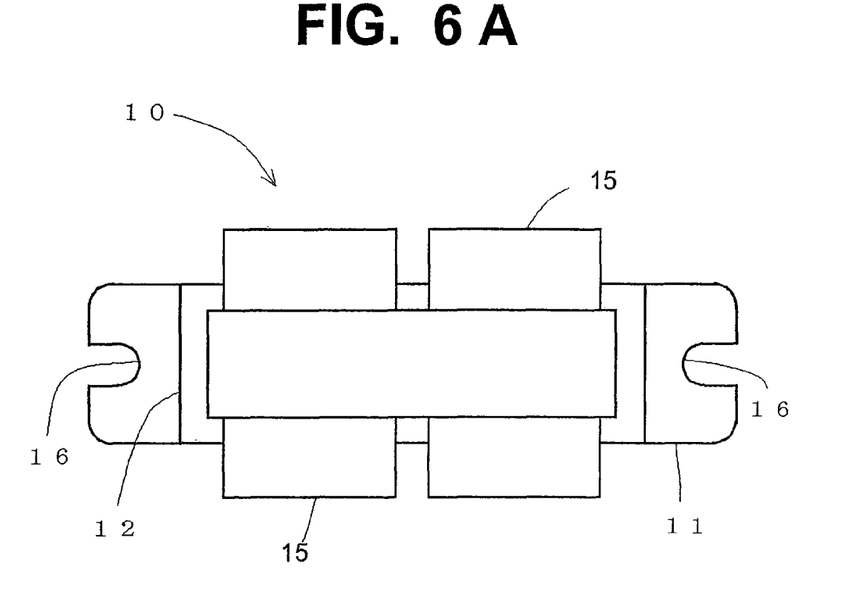
FIGS. 6A and 6B are a plan view and a front view of a package for high frequency usages according to a third embodiment of the invention.
Figure 6B:
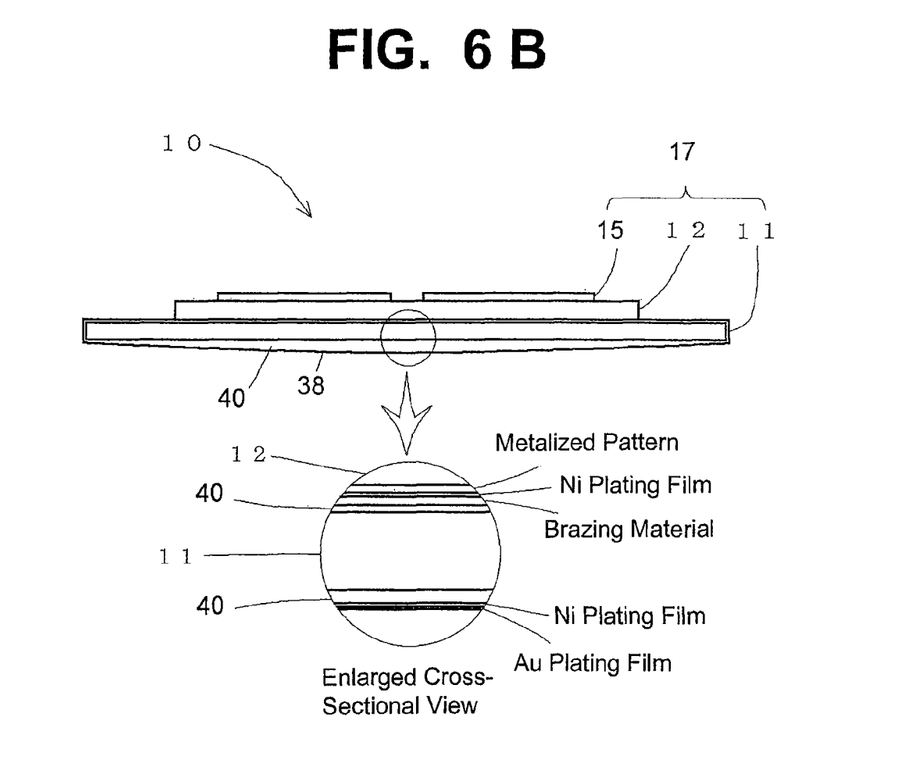

FIGS. 6(A) and (B) are descriptive drawings of a package for high frequency usages according to a third embodiment of the invention.

In the third embodiment, the heat sink plate is coated by a metallic plating film 40 consisting of a Cu plating film with a thickness of approximately 15 μm. A metallic plating film 40 is formed on one of the main surfaces 38 of heat sink plate 11, which is the bottom surface side of package 10 for high frequency usages consisting of a joined member 17, in such a way that its thickness increases to the mid portion in the lengthwise direction so that it protrudes toward the front side in a convex shape. Therefore, the heat dissipated from the semiconductor device to the heat sink is efficiently transmitted to base plate 20.

Moreover, all metallic surfaces of joined member 17 that are exposed are coated with Ni plating film same as in the first and second embodiments, and further covered with Au plating film on top of Ni plating.

Next, the method of manufacturing the package for high frequency usages of the present invention will be described.

Before we describe each individual method, let us describe the processes that are common to all the manufacturing methods.

Heat sink plate 11, ring-like frame member 12, and external connection terminals 15 that constitute joined member 17 are formed respectively as follows.

Forming the Heat Sink Plate

Heat sink plate 11 is made of a metallic substance with a thermal expansion coefficient similar to that of the ceramic material used, for example, a compound metallic substance of Cu—W group made by impregnating copper (Cu) into porous tungsten (W), or a Cu—Mo group alloy consisting of copper (Cu) and molybdenum (Mo). These metals are formed into a rectangular shape using machining or powder metallic methods. If heat sink plate 11 is made of Cu—W, the thermal conductivity of Cu—W is approximately 230 W/m-k so that it is capable of efficiently dissipating the heat generated by semiconductor device 19.

Forming the Ring-like Frame Member

The material that constitutes ring-like frame member 12 can be an insulating material such as a ceramic, e.g., $Al_2O_3$. The ring-like frame can be formed as follows: First, add a plasticizer such as dioctylphtharate, a binder such as acrylic resin, and a solvent, e.g., toluene, xylene, or alcohol to a $Al_2O_3$ powder containing a proper amount of sintering auxiliaries, e.g., magnesia, silica, or calcia, mix it well, and defoam it to obtain a slurry with a viscosity of 2000 to 4000 cps. Next, form a roll-like sheet with a thickness of, for example, 0.25 mm by means of the doctor blade method and the like, and cut it to obtain rectangular ceramic green sheets of an appropriate size. Next, form ring-shaped frame members using one or multiple ceramic green sheets by the punching method. Next, apply with a screen-printing method a metallic conductive paste consisting of a high-melting point metal such as tungsten or molybdenum on one of the surfaces, i.e., bottom surface, as well as on the other surface, i.e., top surface of ring-like frame member 12, to form metallic conductor patterns. If multiple ceramic green sheets are used, laminate the green sheets first, and then apply the metallic conductive past on one side of surface as well as on the other side of surface of the lamination by the screen printing method. Sinter the high-melting point metal and the ceramic green sheet(s) in a reducing atmosphere simultaneously to produce a ring-shaped frame member 12 having metallic conductor pattern on both sides. Heat sink plate 11 will be joined to the metallic conductor pattern on one surface by brazing, and external connection terminals 15 will be joined to the metallic conductor pattern on the other surface in a downstream step. The thermal expansion coefficient of $Al_2O_3$ is approximately $6.7 \times 10^{-6}$/k and the thermal expansion coefficient of Cu—W is approximately $6.7 \times 10^{-6}$/k, so that they are close to each other, but it is difficult to equalize them.

Forming the External Connection Terminal

External connection terminals 15, which are to be joined to the other side surface, i.e., the top surface of ring-like frame member 12, are formed a metallic plate, such as KV (Fe—Ni—Co group alloy; product name "Kovar") or 42 Alloy (Fe—Ni group alloy), whose thermal expansion coefficients are close to that of the ceramic material used, by machining, etching, or punching process or other methods. The thermal expansion coefficient of KV is approximately $5.3 \times 10^{-6}$/k and the thermal expansion coefficient of $Al_2O_3$ is approximately $6.7 \times 10^{-6}$/k, so that they are close to each other, but it is difficult to equalize them.

Next, the method of manufacturing joined member 17 by joining heat sink plate 11, ring-like frame member 12, and external connection terminals 15 will be described.

Forming the Joined Member

First Plating Process:

First, apply the first Ni plating consisting of Ni and Ni alloy on the surface of the metallic conductor pattern on both surfaces of ring-shaped frame member 12.

Brazing Process:

Next, place a high-temperature brazing material 13 consisting of an Ag—Cu brazing metal, such as BAg-8 (eutectic alloy of 72% Ag and the balance consisting of Cu), on one side of heat sink plate 11. Then, place a ring-like frame member 12 on the high-temperature brazing material 13. After that, heat the assembly at the temperature of approximately 780-900° C. to joint heat sink plate 11 and the metallic conductor pattern on one side of surface of ring-shaped frame member 12 by brazing.

Next, place a high-temperature brazing material 13 which includes an Ag—Cu brazing metal, such as BAg-8, on the upper surface of ring-like frame member 12. Then, place external connection terminals 15 on the high temperature brazing material 13. After that, heat the assembly at the temperature of approximately 780-900° C. to joint external connection terminals 15 and the metallic conductor pattern on the other side of surface of ring-shaped frame member 12 by brazing.

The joining of heat sink plate 11 and ring-like frame member 12 and the joining of ring-like frame member 12 and external connection terminals 15 form joined member 17. Although the joining of heat sink plate 11 and ring-like frame member 12 and the joining of ring-like frame member 12 and external connection terminals 15 are performed separately in the above process, they can be performed simultaneously.

Second Plating Process:

Next, apply the second Ni plating on the entire exposed metallic surfaces of joined member 17, and further apply Au plating on the Ni plating to form package 10 for high speed frequency usages.

First Method of Producing the Package of High Frequency Usages

Figure 7A:
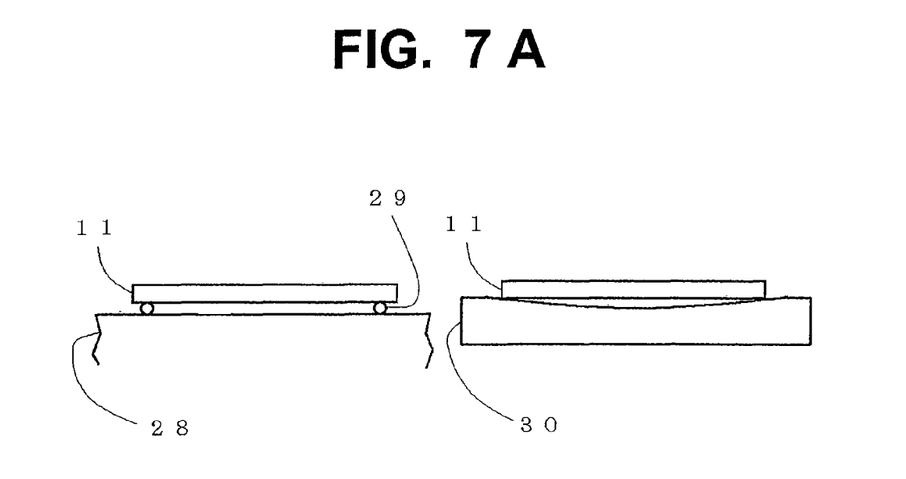
FIGS. 7A and 7B are diagrams showing first and second methods of manufacturing packages for high frequency usages.
Figure 7B:
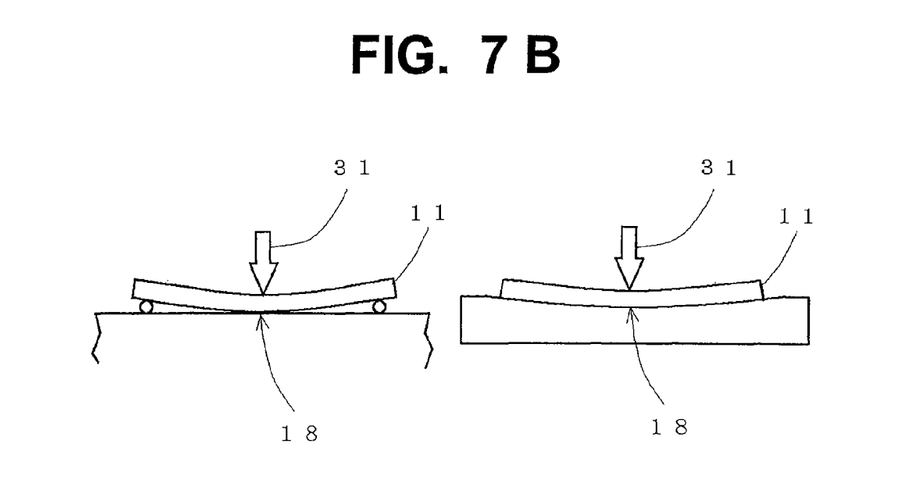

FIGS. 7(A) and (B) are descriptive diagrams showing the method of manufacturing a package for high frequency usages related to the first embodiment. In this manufacturing method, a heat sink plate having a convex second surface warped along its longitude direction is formed by pressing one side of surface of heat sink plate 11 obtained in said process of "Forming the heat sink plate."

First, place heat sink plate 11 across two support rods 29 on a flat base plate 28 consisting of a flat plate. Alternatively, place heat sink plate 11 on a curved base plate 30 having a warped surface as shown in the diagram. Next, press the middle point of heat sink plate 11 as shown in FIG. 7(B) using a pressing member 31 having a cross section of V-shape, U-shape, or any other shape, which is substantially equal to a desired convex shape 18.

Assemble heat sink plate 11 formed as described in the above, a ring-like frame member, and external connection terminals formed in conventional manners in a method similar to the one described in the "Forming of the joined member" section to form a package for high frequency usages.

Second Method of Producing the Package of High Frequency Usages

Packages for high frequency usages according to the first embodiment can also be obtained by the following manufacturing method as well. First, joined member 17 is made according to the method described in the "Forming the joined member" section. Next, press the middle of the surface of heat sink plate 11 that is in contact with the ring-like frame member using pressing member 31 while heating the joined member at temperatures lower than the brazing temperature, i.e., lower than approximately 780° C. Since this heating softens high temperature brazing material 13 that joints heat sink plate 11 with ring-like frame member 12, and ring-like frame member 12 with external connection terminals 15, the other surface of heat sink plate 11 can be formed into a convex shape 18 having a highest protrusion point in the middle of the longitudinal direction without damaging ring-like frame member 12 made of a ceramic material. Flat base plate 28 and curved base plate 30 are made of metal such as stainless steel, and the radius of curvature of curved base plate 30 can be selected depending on the size and shape of heat sink plate 11, preferably in the vicinity of 700-900 mm. The heating temperature is selectable, preferably within 250-400° C., according to the size, shape, and type of joined member 17 and the type of the high temperature brazing material.

Third Method of Producing the Package of High Frequency Usages

Next, the method of manufacturing the package for high frequency usages according to the second embodiment will be described below referring to FIGS. 8(A) through (C). This is a method of obtaining a heat sink plate having a flat surface on one side and a convex surface on the other side formed by means of grinding the heat sink plate in such a way as described in the "Forming the heat sink plate" section.

Figure 8A:
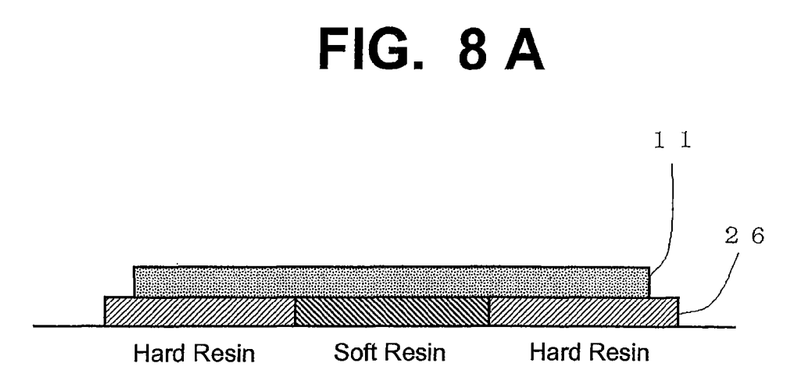
FIGS. 8A, 8B, and 8C are diagrams showing a third method of manufacturing packages for high frequency usages.
Figure 8B:
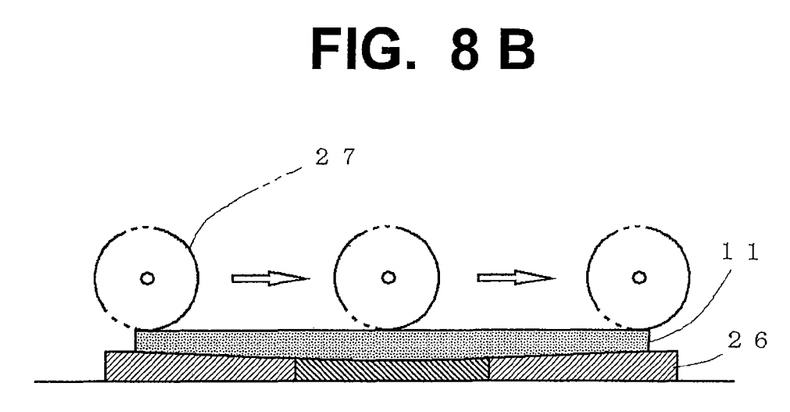
Figure 8C:
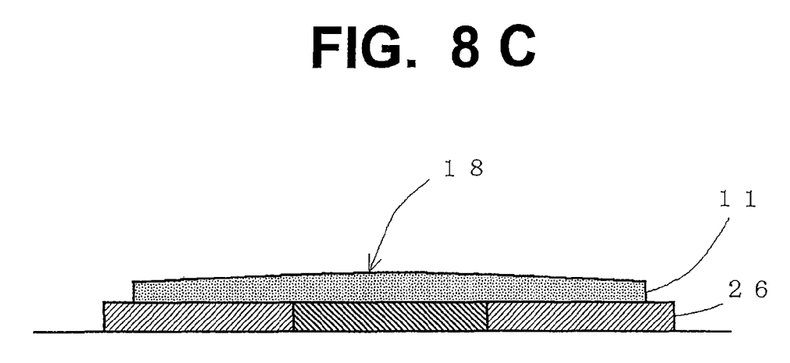

First, as shown in FIG. 8(A), attach to a flat grinding table a resin member 26 consisting of a thermosetting resin material, whose hardness varies between areas at both ends and an area in the middle, and lay on top of said resin member the heat sink plate obtained in the "Forming the heat sink" process. Resin member 26 consists of a high hardness resin, which is harder in the areas where it makes contacts with both ends of heat sink plate 11, and relatively softer in the middle. Next, grind heat sink plate 11 as shown in FIG. 8(B) using a diamond grit grinding wheel 27 or a similar device. During this grinding, a deflection of heat sink plate 11 occurs to cause the heat sink to elude in a direction opposite to the grinding surface. Since heat sink plate 11 eludes (deflects) in a lesser amount in the direction of the surface opposite to the grinding surface in the areas where the hardness of resin member 26, more material is removed by grinding in those areas. In the middle area where the hardness of resin member 26 is lower, heat sink plate 11 eludes (deflects) in a larger amount, more material is removed by grinding there. Consequently, when heat sink plate 11 is freed from the constraint applied during the grinding process, the ground surface ends up in a convex shape having a highest protrusion point in the middle of the longitudinal direction as shown in FIG. 3(C). By peeling off resin member 26 attached to heat sink plate 11, it completes the manufacturing process for a heat sink plate 11 whose surface on the other side is formed into a convex shape 18.

Assemble heat sink plate 11 formed as described in the above, a ring-like frame member, and external connection terminals formed in conventional manners in a method similar to the one described in the "Forming of the joined member" section to form a package for high frequency usages.

Fourth Method of Producing the Package of High Frequency Usages

The package for high frequency usages according to the second embodiment can be manufactured by a method shown in FIGS. 9(A) through (D).

Figure 9A:
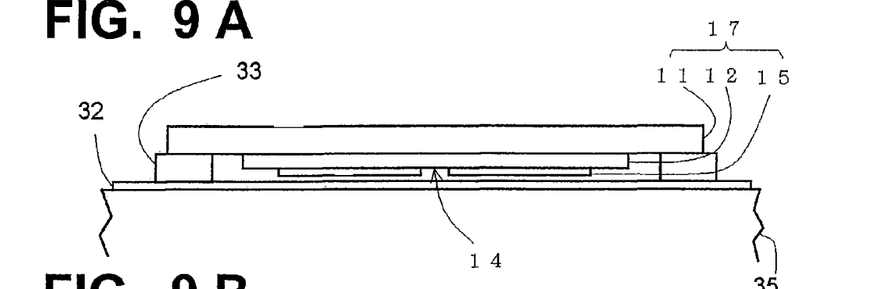
FIGS. 9A, 9B, 9C, and 9D are diagrams showing a fourth method of manufacturing packages for high frequency usages.

First, joined member 17 is made according to the method described in the "Forming the joined member" section.

Next, a thermoplastic resin layer 32 is formed on a flat fixture plate 35 as shown in FIG. 9(A). Next, a spacer 33 for supporting both ends of heat sink plate 11 of the joined member is placed on thermoplastic resin layer 32, and places joined member 17 on spacer 33 with ring-like frame member 12 looking downward as shown in FIG. 9(A). The height of spacer 33 is set higher than the total height of ring-like frame member 12 and external connection terminals 15 so that a space can be created between external connection terminals 15 and thermoplastic resin layer 32.

Figure 9B:
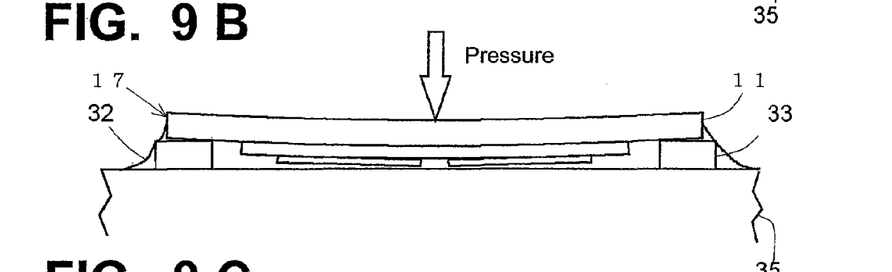

Next, press the middle part in the longitudinal direction of the other main surface of heat sink plate 11 using a press and the like as shown in FIG. 9(B) to bend joined member 17 with spacer 33 as the fulcrum, heat thermosetting resin 32 to make it softer, and fill thermosetting resin 32 into a gap between joined member 17 and fixture plate 35. Thermosetting resin 32 softens and increases its fluidity when it is heated, so that it not only fills the gap between joined member 17 and fixture plate 35 but also covers the circumference of joined member 17 and spacer 33. This pressing and heating causes the other main surface of heat sink plate 11 to cave in from both ends of its longitudinal direction toward the middle part thus creating a concave shape having a lowest point in the middle part. After the above process, it is returned to the normal temperature while it is being pressed to cause the thermoplastic resin to harden, after which the pressure is removed. Joined member 17 is affixed on fixture plate 35 while heat sink plate 11 is warped in a concave shape.

Figures 9C, 9D:
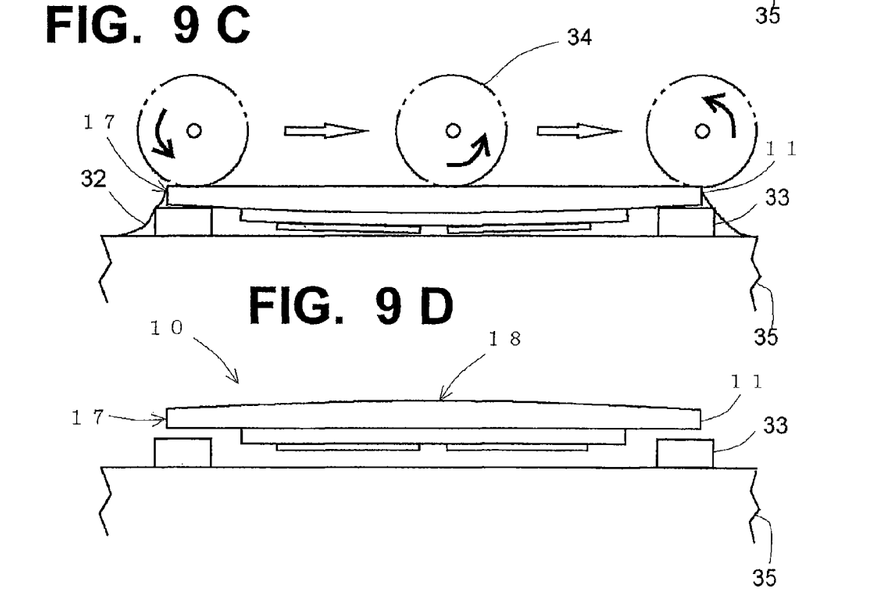

Next, as shown in FIG. 9(C), let the grinding wheel, which is rotating at a high speed, of a grinding machine 34 to travel over horizontally over the other main surface of heat sink plate 11 placed on the table, or let the table to travel horizontally relative to the grinding wheel, which is rotating at a high speed, in order to generate a flat surface with this grinding process. This grinding process is not limited to the use of grinding machine 34 equipped with a grinding wheel as shown above, but can be replaced by any other metal cutting process such as using a milling machine, or by lapping process using abrasive grits.

Next, heat thermoplastic resin 32 to soften it and remove joined member 17, which is affixed on fixture plate 35 with thermoplastic resin 32 from fixture plate 35 as shown in FIG. 9(D). Joined member 17, which has contained the deflection generated by the pressure from the other main surface of heat sink plate 11, releases the deflection as it is removed from fixture plate 35 and causes its other main surface of heat sink plate 11 to protrude from both ends of the longitudinal direction toward the middle part, thus generating a convex shape 18 having a maximum protruding point in the middle part. Thermoplastic resin 32 adhered to joined member 17, fixture plate 35, and spacer 33 is peeled off and removed with solvent and peeling liquid. Thermoplastic resin 32 can be easily peeled off and removes as it has an excellent peeling characteristic. In package 10 for high frequency usages produced in such a way as described in the above, the other main surface of heat sink plate 11 has a convex shape 18 that protrudes from both ends towards the middle and has its highest protruding point in the middle, so that it can make a close contact with base plate 20 and has an improved heat dissipation characteristic.

Fifth Method of Producing the Package of High Frequency Usages

Figure 10A:
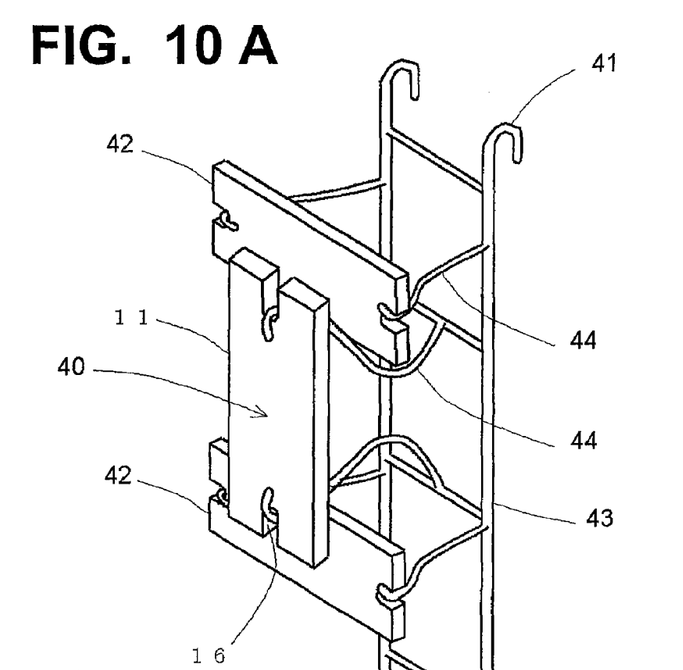
FIGS. 10A and 10B are diagrams showing a fifth method of manufacturing packages for high frequency usages.
Figure 10B:
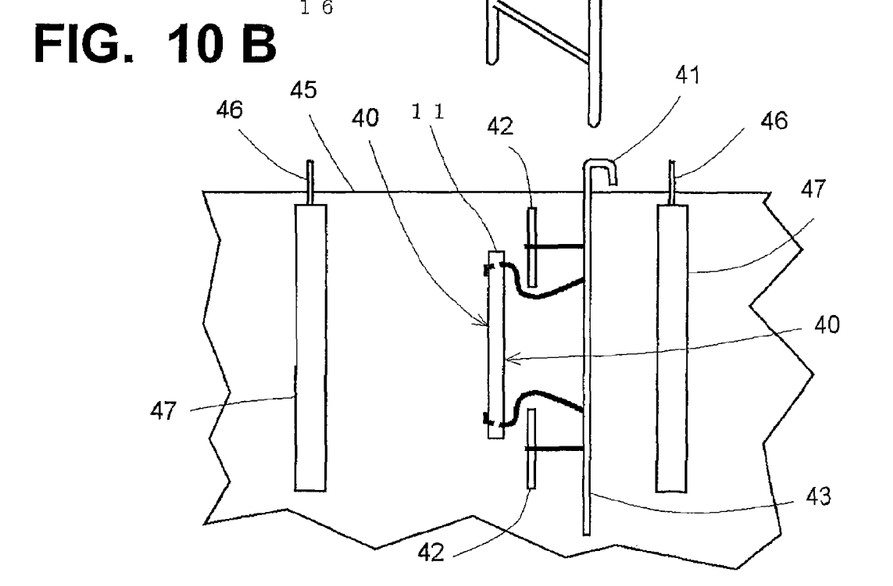

FIGS. 10(A) and (B) are drawings for describing the method of manufacturing the package for high frequency usages according to the third embodiment of the present invention. In this method, metal plating film 40 is formed according to the following method on the heat sink plate obtained in the "Forming the heat sink plate" process.

First, heat sink plate 11 is attached to hooks 44 of a plating rack 43. Next, a dummy member 42, i.e., a metallic plate made of stainless steel and the like, which serves as a sacrificial electrode to be connected to a cathode electrode 41, is provided in the vicinity of each end in the longitudinal direction of heat sink plate 11 between heat sink plate 11 and plating rack 43 in such a way that it essentially faces against the main surface of heat sink plate 11. Heat sink plate 11 and dummy member 42 are both held in place by hooks 44 that are mounted on plating rack 43, and plating rack 43 forms cathode electrode 41. Heat sink plate 11 and dummy member 42 are immersed into a plating bath 45 together with plating rack 43 as shown in FIG. 10(B). In this plating bath 45, metallic members 47 that are connected with anode electrode 46 are provided on one side or both sides of a position where heat sink plate 11 and the main surface of dummy member 42 are facing each other. In the electrolytic plating method, metal plating film 40 is formed by causing metallic ions in plating bath 45 to deposit on heat sink plate 11 and dummy member 42 on the side of cathode electrode 41 by feeding electricity through plating rack 43. In the electrolytic method, it also causes metallic member 47 on the side of anode electrode 46 to elute into plating bath 45 by feeding electricity to anode electrode 46, which is done simultaneously with electricity feeding to cathode electrode 41. The thickness of metallic plating film 40 deposited on heat sink plate 11 is affected by metallic films deposited on dummy members 42 located in the vicinities of both ends of the longitudinal direction of heat sink plate 11 and hence varies along the lengthwise direction of heat sink plate 11. This makes it possible to make the plating film thickness in the middle of the lengthwise direction of heat sink plate 11 thicker than the plating film thickness on both ends in the longitudinal direction.

In order to control the thickness of metal plating film 40 on one of the main surfaces of heat sink plate 11, which is the bottom side of package 10 for high frequency usages, it is preferable to form metal plating film 40 by providing dummy member 42 between one of the main surfaces of heat sink plate 11 and metallic member 47 that faces said face. If metal plating film 40 formed on heat sink plate 11 consists of a Cu plating film, pyrophoric acid bath or copper sulfate batch is generally used as the plating bath, while phosphoric copper is used as metallic member 47.

Assemble heat sink plate 11 formed as described in the above, a ring-like frame member, and external connection terminals formed in conventional manners in a method similar to the one described in the "Forming of the joined member" section to form a package for high frequency usages.

EXAMPLES OF PRACTICAL EMBODIMENTS

The inventor prepared a heat sink plate starting with a flat heat sink plate made of Cu—W with external dimensions of 40×10 mm and a thickness of 1.6 mm, keeping one surface flat, and machining the other surface, which is to be made to contact with the base plate of the heat sink plate, into a convex shape protruding from both ends of the lengthwise direction of the heat sink plate towards the middle area so that its maximum protruding point lies in the middle area. The inventor also prepared a ring-like frame member made of $Al_2O_3$ with external dimensions of 31×9.5 mm, internal dimensions of 27.5 mm ×6 mm, and a thickness of 0.25 mm as well as four external connection terminals made of KV with external dimensions of 11.5 mm×5 mm and a thickness of 0.15 mm. The inventor brazed one surface of the heat sink plate with one surface of the ring-like frame member and another surface of the ring-like frame member with the external connection terminals using Ag—Cu brazing metal consisting of BAg-8 to form the package for high frequency usages of the first embodiment.

The inventor also prepared a heat sink plate by starting with a flat heat sink plate made of Cu—W with external dimensions of 40×10 mm and a thickness of 1.6 mm, laying the heat sink plate on a curved base plate having a radius of curvature of 800 mm, and pressing from one surface of the heat sink plate so that the other surface of the heat sink plate is formed into a convex shape protruding from both ends of the longitudinal direction of the heat sink plate towards the middle area so that its maximum protruding point lies in the middle area. The inventor also prepared, similar to the case of the embodiment 1, a ring-like frame member made of $Al_2O_3$ with external dimensions of 31×9.5 mm, internal dimensions of 27.5 mm×6 mm, and a thickness of 0.25 mm as well as four external connection terminals made of KV with external dimensions of 11.5 mm×5 mm and a thickness of 0.15 mm. The inventor brazed one surface of the heat sink plate with one surface of the ring-like frame member and another surface of the ring-like frame member with the external connection terminals using Ag—Cu brazing metal consisting of Bag-8 to form the package for high frequency usages of the second embodiment.

The inventor also prepared a flat heat sink plate made of Cu—W with external dimensions of 40×10 mm and a thickness of 1.6 mm, a ring-like frame member made of $Al_2O_3$ with external dimensions of 31×9.5 mm, internal dimensions of 27.5 mm×6 mm, and a thickness of 0.25 mm as well as four external connection terminals made of KV with external dimensions of 11.5 mm×5 mm and a thickness of 0.15 mm for the purpose of comparison. The inventor brazed one surface of the heat sink plate with one surface of the ring-like frame member and another surface of the ring-like frame member with the external connection terminals using Ag—Cu brazing metal consisting of BAg-8 to form the package for high frequency usages of the prior art.

The warping occurrence rate of the other surface, which is the bottom surface, of the heat sink plate before and after the brazing operation was measured for 10 samples each of the first embodiment, the second embodiment, and comparison example. The measurement result is shown as a line graph in FIG. 11. The range of each arrow in the vertical axis shows the range of fluctuation of each warping measurement values in each case. If the value of a warping value is positive, it represents a convex warp, while if the value of a warping value is negative, it represents a concave warp.

Figure 11:
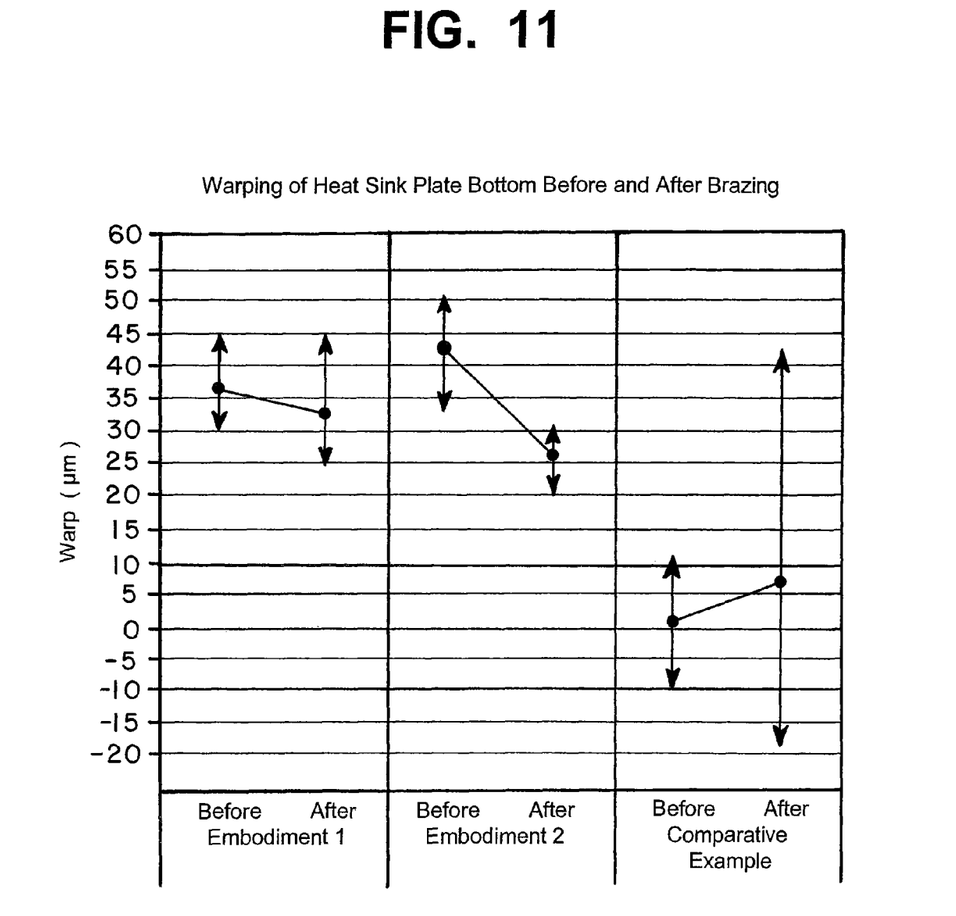
FIG. 11 is a graph showing the warping value of the heat sink plate.

All measurements in the first and second embodiments indicated convex warps and the heat sink plate was confirmed to be solidly in contact with the base in all of them, so that it was confirmed that making the other surface of the heat sink plate is effective in assuring a good contact. On the other hand, both convex and concave warps existed in a mixed manner and the warping values fluctuated more substantially in case of the comparison cases. It was confirmed further that those with concave warps generated gaps in the joining area with the base and the contact is generally poor.

Hence obvious changes may be made in the specific embodiment of the invention described herein, such modifications being within the spirit and scope of the invention claimed, it is indicated that all matter contained herein is intended as an illustrative and not as limiting in scope.

What is claimed is:

1. A method of manufacturing a package for high frequency usages comprising the steps of:
    preparing a heat sink plate having a first surface and a second surface situated on the opposite side of said first surface;
    joining by brazing a first surface of a ring-shaped frame member made of ceramic to the first surface of said heat sink plate;
    joining by brazing external connection terminals to a second surface of said ring-like frame member; and
    forming the second surface of said heat sink plate into a convex shape curved along its longitudinal direction by pressing the joined heat sink plate from the first surface side while heating the joined heat sink plate at a temperature lower than a temperature of the joining steps.

2. A method of manufacturing a package for high frequency usages comprising the steps of:
    arranging a heat sink on a flat resin layer, said resin layer comprising a hard resin layer that contacts at both ends of the heat sink plate in its longitudinal direction and a softer resin layer that contacts the heat sink plate in the middle;
    grinding the surface of said heat sink plate along its longitudinal direction, wherein the amount of grinding is larger at each end of the heat sink plate in its longitudinal direction as an eluding motion of the heat sink plate into the resin layer is smaller and the amount of grinding is smaller in the middle of the heat sink plate as the eluding motion is greater, thus forming a convex surface that curves along its longitudinal direction when the grinding is done;
    joining a first surface of a ring-shaped frame member made of ceramic to the surface opposite to the ground surface of said heat sink plate; and
    joining external connection terminals to a second surface of said ring-like frame member.

3. A method of manufacturing a package for high frequency usages comprising the steps of:
    forming a joined member wherein a first surface of a ring-like frame member made of ceramic is joined to a first surface of a heat sink plate, and external connection terminals are joined to a second surface of said ring-shaped frame member situated on the opposite side of the first surface;
    forming a thermoplastic resin layer on a fixture plate;
    arranging two spacers separated by a predetermined space on said thermoplastic resin layer;
    placing said joined member on said two spacers so that the ring-shaped frame member is located between the two spacers, wherein a gap is formed between the external connection terminals and the thermoplastic resin by setting the height of the spacers greater than the total thickness of the ring-shaped frame and the external connection terminals;
    warping said joined member by pressing the middle of said heat sink plate, and filling said gap between the joined member and said fixture plate with said thermoplastic resin after softening the thermoplastic resin by heating;
    hardening said thermoplastic resin by taking it back to the normal temperature while maintaining it under the pressed condition, and joining said warped joined member to said fixture plate;
    flatly grinding a second surface of said heat sink plate;
    forming the second surface of said heat sink plate into a convex surface curved along its longitudinal direction by releasing the warping of said joined member by softening said thermoplastic resin by heating; and
    peeling and removing said thermoplastic resin.

4. A method of manufacturing a package for high frequency usages comprising the steps of:
    preparing a heat sink plate having a first surface and a second surface;
    providing a metal plating coat on said heat sink plate by the electrolytic plating method comprising the following steps:
        connecting the heat sink plate to a cathode electrode;
        placing a metal dummy member connected to the cathode electrode in a vicinity of each end of the second surface of the heat sink plate in the longitudinal direction; and
        plating electrolytically the heat sink plate and the dummy member, forming a convex-shaped plating surface on the second surface side, and said surface curving along its longitudinal direction;
    joining one of the surfaces of a ring-shaped frame member made of ceramic to the plating surface of the first surface; and
    joining external connection terminals to the other surface of said ring-like frame member.

* * * * *